(12) United States Patent
Nakayama (10) Patent No.: US 8,871,350 B2
(45) Date of Patent: Oct. 28, 2014

(54) GAS BARRIER FILM, ELECTRONIC DEVICE INCLUDING THE SAME, GAS BARRIER BAG, AND METHOD FOR PRODUCING GAS BARRIER FILM

(75) Inventor: Hiroshi Nakayama, Osaka (JP)

(73) Assignees: Material Design Factory Co., Ltd., Osaka-shi (JP); Air Water Inc., Sapporo-shi (JP)

( * ) Notice: Subject to any disclaimer, the term of this patent is extended or adjusted under 35 U.S.C. 154(b) by 101 days.

(21) Appl. No.: 13/259,109

(22) PCT Filed: Mar. 23, 2010

(86) PCT No.: PCT/JP2010/054930
§ 371 (c)(1),
(2), (4) Date: Sep. 22, 2011

(87) PCT Pub. No.: WO2010/113693
PCT Pub. Date: Oct. 7, 2010

(65) Prior Publication Data
US 2012/0009368 A1    Jan. 12, 2012

(30) Foreign Application Priority Data
Mar. 30, 2009    (JP) ................... 2009-082867

(51) Int. Cl.
| | | |
|---|---|---|
| *B32B 9/04* | (2006.01) | |
| *B29D 22/00* | (2006.01) | |
| *C23C 16/36* | (2006.01) | |
| *H01L 51/52* | (2006.01) | |
| *H01L 31/0392* | (2006.01) | |
| *H01L 31/048* | (2014.01) | |
| *C23C 16/30* | (2006.01) | |
| *C23C 16/44* | (2006.01) | |
| *H01L 31/0216* | (2014.01) | |

(52) U.S. Cl.
CPC ............ *H01L 51/5237* (2013.01); *C23C 16/36* (2013.01); *H01L 31/0392* (2013.01); *H01L 31/048* (2013.01); *C23C 16/30* (2013.01); *C23C 16/44* (2013.01); *Y02E 10/50* (2013.01); *H01L 31/02167* (2013.01)
USPC .......................................... 428/446; 428/35.7

(58) Field of Classification Search
CPC ........ C23C 16/30; C23C 16/36; C23C 16/44; H01L 31/02167; H01L 31/0392
USPC ...................................... 428/446, 35.4, 35.7
See application file for complete search history.

(56) References Cited

U.S. PATENT DOCUMENTS

2004/0152334 A1    8/2004    Ohto et al.
2007/0020451 A1    1/2007    Padiyath et al.

(Continued)

FOREIGN PATENT DOCUMENTS

CN    1518075 A    8/2004
CN    101228217 A    7/2008

(Continued)

OTHER PUBLICATIONS

Machine Translation of JP 2008-155585 A; Nakayama; 2008.*
Office Action in Chinese Patent Application No. 201080014250.0, dated Feb. 20, 2013.

(Continued)

*Primary Examiner* — James Yager
(74) *Attorney, Agent, or Firm* — Venable LLP; Michael A. Sartori; Tamatane J. Aga (57) ABSTRACT

A gas barrier film in which a gas barrier layer deposited by catalyst CVD in contact with each of both main surfaces of a plastic film is an SiCNFH layer satisfying conditions of $0.01 < I(SiH)/I(SiN) < 0.05$, $0.00 < I(CH)/I(SiN) < 0.07$, $0.04 < I(NH)/I(SiN) < 0.08$, and $0.05 < I(CF)/I(SiN) < 0.3$; an SiOCNH layer satisfying conditions of $0.1 < I(SiH)/I(NH) < 0.9$, $0.0 < I(CH)/I(NH) < 0.3$, $8 < I(SiN)/I(NH) < 20$, and $2 < I(SiO_2)/I(NH) < 8$; or an SiCNH layer satisfying conditions of $0.01 < I(SiH)/I(SiN) < 0.05$, $0.00 < I(CH)/I(SiN) < 0.07$ and $0.04 < I(NH)/I(SiN) < 0.08$. Here, the "I" represents peak intensity of Fourier transform infrared spectroscopy related to an atomic bond shown in the parentheses after the "I".

9 Claims, 7 Drawing Sheets

(56) References Cited

U.S. PATENT DOCUMENTS

| | | | |
|---|---|---|---|
| 2007/0246804 A1 | 10/2007 | Ohto et al. | |
| 2008/0009141 A1 | 1/2008 | Dubois et al. | |
| 2008/0265442 A1* | 10/2008 | Yagi | 257/786 |
| 2009/0169770 A1 | 7/2009 | Padiyath et al. | |
| 2009/0186209 A1 | 7/2009 | Padiyath et al. | |

FOREIGN PATENT DOCUMENTS

| | | |
|---|---|---|
| JP | 2002-532850 A | 10/2002 |
| JP | 2004-221275 A | 8/2004 |
| JP | 2005-179693 A | 7/2005 |
| JP | 2006-233064 A | 9/2006 |
| JP | 2007-088495 A | 4/2007 |
| JP | 2008-155585 A | 7/2008 |
| JP | 2009-502554 A | 1/2009 |
| WO | WO-00/36665 A1 | 6/2000 |
| WO | WO-2007/015779 A2 | 2/2007 |

OTHER PUBLICATIONS

Markus Hörz et al., "Novel polysilazanes as precursors for silicon nitride/silicon carbide composites without "free" carbon," Journal of the European Ceramic Society, vol. 25, No. 2-3, Jan. 2005, pp. 99-110.

Yoshimi Shioya et al., "Properties of Low-$k$ Cu Barrier SiOCNH Film Deposited by Plasma-Enhanced hemical Vapor Deposition using Hexamethyldisiloxane and Ammonia Gases," Japanese Journal of Applied Physics, vol. 43, No. 2, Feb. 2004, pp. 750-756.

Stephan Trassl et al., "Electrical properties of amorphous $SiC_xN_yH_z$-ceramics derived from polyvinylsilazane," Journal of the European Ceramic Society, vol. 23, No. 5, Apr. 2003, pp. 781-789.

A. Dollet et al., "Analysis and numerical modelling of silicon nitride deposition in a plasma-enhanced chemical vapour deposition reactor. Part II: simplified modelling, systematic analysis and comparison with experimental measurements," Plasma Sources Science and Technology, vol. 4, No. 1, Feb. 1995, pp. 107-116.

European Search Report in European Patent Application No. 10758467.4-1555, dated Jun. 4, 2013.

* cited by examiner

GAS BARRIER FILM, ELECTRONIC DEVICE INCLUDING THE SAME, GAS BARRIER BAG, AND METHOD FOR PRODUCING GAS BARRIER FILM

TECHNICAL FIELD

The present invention is related to a gas barrier film for preventing penetration of undesired gas so as to protect various goods and maintain properties thereof, an article utilizing the gas barrier film, and a method for producing the gas barrier film.

BACKGROUND ART

Articles such as food, medicine, a touch panel, an organic EL (electroluminescence) device, an inorganic EL device, a solar cell, and electronic paper are altered and deteriorated by moisture and oxygen in the atmosphere, thereby losing their value for sale. Therefore, packing or sealing is utilized by using a film having a so-called gas barrier property for preventing transmission of moisture and oxygen in the atmosphere.

However, the grade of the barrier property required for the gas barrier film for protecting and maintaining the properties of the various articles as mentioned above depends on the kinds of those articles. For example, a very high grade of the barrier property is required for a gas barrier film used for an organic EL device. As compared to this, however, a gas barrier film not having such a high grade of the barrier property can be used for protecting goods such as food and medicine.

In the meantime, while the organic EL display device draws attention as a light-emitting display, the organic molecular layers such as an organic light-emitting layer, an electron transport layer and a positive-hole transport layer have their fatal weak point that they react with moisture and oxygen in the atmosphere and are degraded.

As it stands now, therefore, the organic EL device is formed on a glass substrate which moisture and oxygen hardly penetrate and is covered with a sealing can or glass so as to extend the device lifetime.

In this case, there is a cost problem caused by the sealing can or sealing glass. As a measure to solve the problem, a so-called thin-film sealing technique is desired, in which a gas barrier layer is formed with a thin film in place of the sealing can or sealing glass.

From a technical viewpoint of a display device that is flexible and lightweight and expected as a future article, it is also desirable to develop a display device in which an organic EL layer is formed on a plastic film without using a glass substrate.

For that purpose, it is necessary to realize a gas barrier film for preventing transmission of moisture and oxygen harmful to the EL layer and realize a thin-film sealing technique for protecting the organic EL device formed on the barrier film.

As technical problems in developing a flexible organic EL device, therefore, it is first necessary to realize a technique for forming a film that adheres tightly to a plastic film and has a high barrier property, and it is secondly necessary to realize a thin-film sealing technique using a gas barrier film for protecting the organic EL layer that is sensitive to gas, heat and plasma and then is liable to be damaged.

As an attempt to solve these problems, a patent literature 1 of Japanese National Paten Publication No. 2002-532850 discloses an example of a method for forming a barrier film. In the method discloses by this patent literature 1, a barrier film is formed with a stacked-layer structure of polymer layers and inorganic material layers. The polymer layers are formed by vapor deposition of monomers (typically, monomers containing acrylate) and subsequent photo polymerization due to ultraviolet irradiation. Further, as the inorganic material layers, layers such as of silica, alumina, titania, indium oxide, tin oxide, aluminum nitride, or silicon nitride are formed by sputtering or the like. Then it is considered that the polymer layers are used mainly for planarization of the organic EL device and fill defects in the inorganic material layers, while the inorganic material layers show a barrier property.

A problem in the barrier film according to patent literature 1 is that the film must be made as thick as about 10 micrometers by alternately stacking many times the polymer layers and the inorganic material layers in order to obtain a high barrier property. Further, since various treatment processes such as vacuum evaporation, photo polymerization and sputtering and then apparatus for the processes are required for production of the barrier film, the manufacturing facilities becomes complicated and the production cost is increased. Furthermore, since the polymer layers themselves hardly have a barrier property and the inorganic material layers themselves usually become porous and polycrystalline particle state, it is difficult to prevent invasion of moisture and oxygen particularly through the side surfaces of the organic EL device.

In the meantime, a patent literature 2 of Japanese Patent Laying-Open No. 2008-155585 discloses a gas barrier film including a first, a second and a third organic-inorganic hybrid layer. Each of these organic-inorganic hybrid layers contains carbon, silicon, nitrogen, and hydrogen that have been intentionally introduced. In this case, the first and third organic-inorganic hybrid layers deposited by plasma CVD (chemical vapor deposition) have greater carbon composition ratios as compared with the second organic-inorganic hybrid layer deposited by Cat-CVD (catalyst CVD). On the other hand, the second organic-inorganic hybrid layer is set to have greater composition ratios of silicon and nitrogen as compared with the first and third hybrid layers.

Incidentally, it should be noted that while the organic-inorganic hybrid material means a combination of organic material and inorganic material, the material called particularly as the organic-inorganic hybrid material is in a mixed state in a nano range or a molecular range differently from a simple mixture such as the conventionally known composite material (refer to a patent literature 3 of Japanese Patent Laying-Open No. 2005-179693, for example).

CITATION LIST

Patent Literature

PTL 1: Japanese National Patent Publication No. 2002-532850
PTL 2: Japanese Patent Laying-Open No. 2008-155585
PTL 3: Japanese Patent Laying-Open No. 2005-179693

SUMMARY OF INVENTION

Technical Problem

The gas barrier film disclosed in patent literature 2 can bring about an excellent gas barrier property only by including a much smaller stacked-layer number of the gas barrier layers as compared to the gas barrier film disclosed in patent literature 1. Further, the gas barrier film disclosed in patent literature 2 can be produced easily at low cost as compared to the gas barrier film disclosed in patent literature 1.

However, it is hoped in the technical field of the gas barrier film to further improve the barrier property of the barrier film and improve the simplicity and cost of production thereof.

Therefore, an object of the present invention is to further improve the barrier property of the gas barrier film disclosed in patent literature 2 and further improve the simplicity and cost of production thereof.

Solution to Problem

A gas barrier film according to the present invention includes a gas barrier layer in contact with each of both main surfaces of a plastic film, wherein this gas barrier layer is an SiCNFH layer, an SiOCNH layer or an SiCNH layer deposited by Cat-CVD, the SiCNFH layer satisfying conditions of $0.01 < I(SiH)/I(SiN) < 0.05$, $0.00 < I(CH)/I(SiN) < 0.07$, $0.04 < I(NH)/I(SiN) < 0.08$, and $0.05 < I(CF)/I(SiN) < 0.3$; the SiOCNH layer satisfying conditions of $0.1 < (SiH)/I(NH) < 0.9$, $0.0 < I(CH)/I(NH) < 0.3$, $8 < I(SiN)/I(NH) < 20$, and $2 < I(SiO_2)/I(NH) < 8$; and the SiCNH layer satisfying conditions of $0.01 < I(SiH)/I(SiN) < 0.05$, $0.00 < I(CH)/I(SiN) < 0.07$ and $0.04 < I(NH)/I(SiN) < 0.08$; where the "I" represents peak intensity of Fourier transform infrared spectroscopy (referred to as FTIR) related to the atomic bond shown in the parentheses after the "I".

Incidentally, it is preferable that the SiCNFH layer satisfies conditions of $0.01 < (SiH)/I(SiN) < 0.03$, $0.00 < I(CH)/I(SiN) < 0.02$, $0.05 < I(NH)/I(SiN) < 0.08$, and $0.05 < I(CF)/I(SiN) < 0.25$; the SiOCNH layer satisfies conditions of $0.1 < I(SiH)/I(NH) < 0.5$, $0.0 < I(CH)/I(NH) < 0.2$, $10 < I(SiN)/I(NH) < 20$, and $2 < I(SiO_2)/I(NH) < 5$; and the SiCNH layer satisfies conditions of $0.01 < I(SiH)/I(SiN) < 0.03$, $0.00 < I(CH)/I(SiN) < 0.02$ and $0.05 < I(NH)/I(SiN) < 0.08$.

Further, the plastic film is preferably a heat-resistive plastic film having a glass transition temperature of 120° C. or more, a melting point of 200° C. or more, or a liquid-crystal transition temperature of 200° C. or more. It is also preferable that the plastic film has been subjected to a surface-planarization process.

It is still further preferable that the gas barrier film additionally includes an electric-conductive layer over the gas barrier layer.

It is possible to improve durability of various electronic devices by incorporating therein the gas barrier film of the present invention as a protective film. Such an electronic device can be one of a touch panel, an organic EL device, an inorganic EL device, a thin film solar cell, and electronic paper. Further, the gas barrier bag formed with the gas barrier film of the present invention can maintain properties of various goods and extend storage life of the goods.

In a method for producing the gas barrier film of the present invention, the gas barrier film can be easily formed at low cost by Cat-CVD using source materials selected from an organic silane compound, an organic amino-silicon compound, ammonia, fluorocarbon, oxygen, and hydrogen.

ADVANTAGEOUS EFFECTS OF INVENTION

By forming the gas barrier layer in contact with each of both the main surfaces of the plastic film with Cat-CVD according to the present invention, it is possible to provide the gas barrier film in which the barrier property can be improved and the simplification and cost reduction of production thereof can be achieved as compared to the prior art.

Further, by utilizing the gas barrier film, it is possible to prevent degradation of the device properties and also possible to provide the gas barrier bag that can protect various goods.

DESCRIPTION OF EMBODIMENTS

Figure 1:
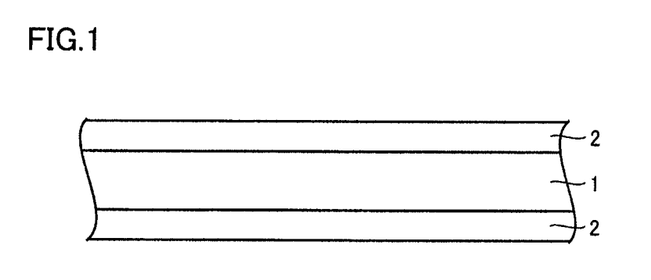
FIG. 1 is a schematic cross-sectional view of a gas barrier film according to an embodiment of the present invention.

FIG. 1 shows a cross-sectional view of a gas barrier film according to an embodiment of the present invention. In this barrier film, a gas barrier layer 2 formed of a particular organic-inorganic hybrid layer is provided on each of both main surfaces of a plastic film 1.

The particular organic-inorganic hybrid layer is an SiCNFH layer, an SiOCNH layer or an SiCNH layer deposited by Cat-CVD, the SiCNFH layer satisfying conditions of $0.01 < I(SiH)/I(SiN) < 0.05$, $0.00 < I(CH)/I(SiN) < 0.07$, $0.04 < I(NH)/I(SiN) < 0.08$, and $0.05 < I(CF)/I(SiN) < 0.3$; the SiOCNH layer satisfying conditions of $0.1 < I(SiH)/I(NH) < 0.9$, $0.0 < I(CH)/I(NH) < 0.3$, $8 < I(SiN)/I(NH) < 20$, and $2 < I(SiO_2)/I(NH) < 8$; and the SiCNH layer satisfying conditions of $0.01 < I(SiH)/I(SiN) < 0.05$, $0.00 < I(CH)/I(SiN) < 0.07$ and $0.04 < I(NH)/I(SiN) < 0.08$; where the "I" represents FTIR spectral peak intensity related to an atomic bond shown in the parentheses after the "I".

Incidentally, the wavenumber positions of the FTIR spectral peaks are about 870 $cm^{-1}$ for an SiN bond, about 2170 $cm^{-1}$ for an SiH bond, about 2920 $cm^{-1}$ for a CH bond, about 3380 $cm^{-1}$ for an NH bond, about 1170 $cm^{-1}$ for a CF bond, and about 1150 $cm^{-1}$ for an $Si_2O$ bond. The intensity "I" is evaluated by peak intensity of optical density of spectral absorption.

Figure 2:
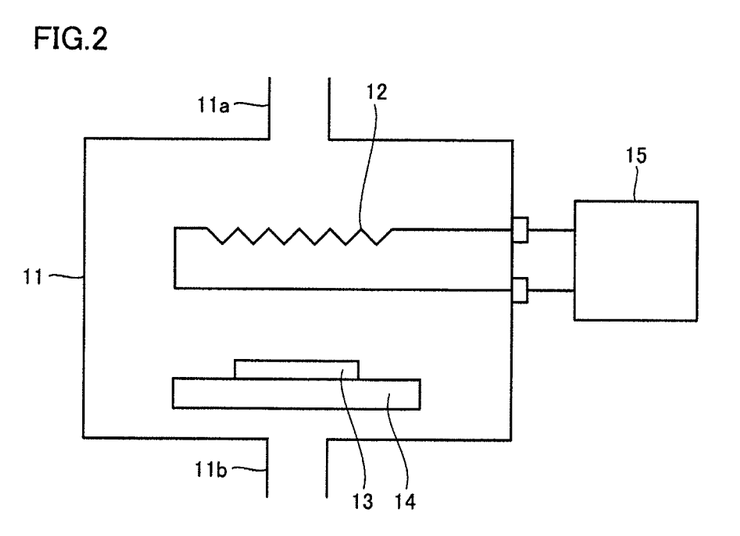
FIG. 2 is a schematic block diagram showing an example of a Cat-CVD film-forming apparatus capable of forming an organic-inorganic hybrid layer.

FIG. 2 illustrates a schematic block diagram showing an example of a Cat-CVD apparatus capable of forming an organic-inorganic hybrid layer as described above. This film-forming apparatus includes a reaction chamber 11 having a gas inlet 11a and a gas outlet 11b. A heating filament 12, a base or substrate (plastic film etc.) 13 opposing thereto and a pedestal 14 for supporting the substrate are provided inside reaction chamber 11. Filament 12 is connected to an electric power source 15 provided outside reaction chamber 11. As seen in FIG. 2, in this synthesis with heating, various organic-inorganic hybrid films can be formed in the very simple and low-cost film-forming apparatus. Heating filament 12 is formed with a high melting point metal such as Ta or W and is usually heated to approximately 1100° C. to 1300° C. during film formation on the plastic film substrate so as to suppress thermal deformation of the plastic film due to heat radiation from the heating filament.

With the Cat-CVD as mentioned above, it is possible to deposit the SiCNFH layer, SiOCNH layer and SiCNH layer as the particular organic-inorganic hybrid layers in the present invention. In the Cat-CVD, it is possible to preferably use source gases selected from an organic silane compound, an organic amino-silicon compound, ammonia, fluorocarbon, oxygen, and hydrogen.

EXAMPLES

In the following, gas barrier films according to various Examples of the present invention will be explained together with a gas barrier film according to a Reference Example closely related to the present invention.

Reference Example 1

In Reference Example 1 closely related to the present invention, the present inventor has first examined a barrier property of a gas barrier film in which a single organic-inorganic hybrid layer of an SiCNFH layer was formed on only one main surface of an underlying plastic film.

In this Reference Example 1, a single SiCNFH layer of 1000 rim target thickness was formed on a plastic film of 200 μm thick PEN (polyethylene naphthalate) by a Cat-CVD method. During formation of the SiCNFH layer by this Cat-CVD, monomethylsilane(referred to as "1MS")/$H_2$/$N_2$/$NH_3$/$C_4F_8$ were introduced at a flow rate of 5/200/200/200/20 (sccm) into the film-forming apparatus.

When various atomic bonds included in the SiCNFH layer thus obtained were examined, atomic bonds such as SiN, CF, SiH, CH, and NH were observed and therefore it is recognized that the layer was an organic-inorganic hybrid layer.

In this Reference Example 1, the barrier property of the gas barrier film having the single SiCNFH layer only on the one main surface of the PEN film was measured with a gas transmission rate measurement device available from Lyssy Co. Specifically, a barrier tester L80-5000 (JIS-K7129-A method) was used for measurement of the water vapor transmission rate (also called as WVTR).

Figure 3:
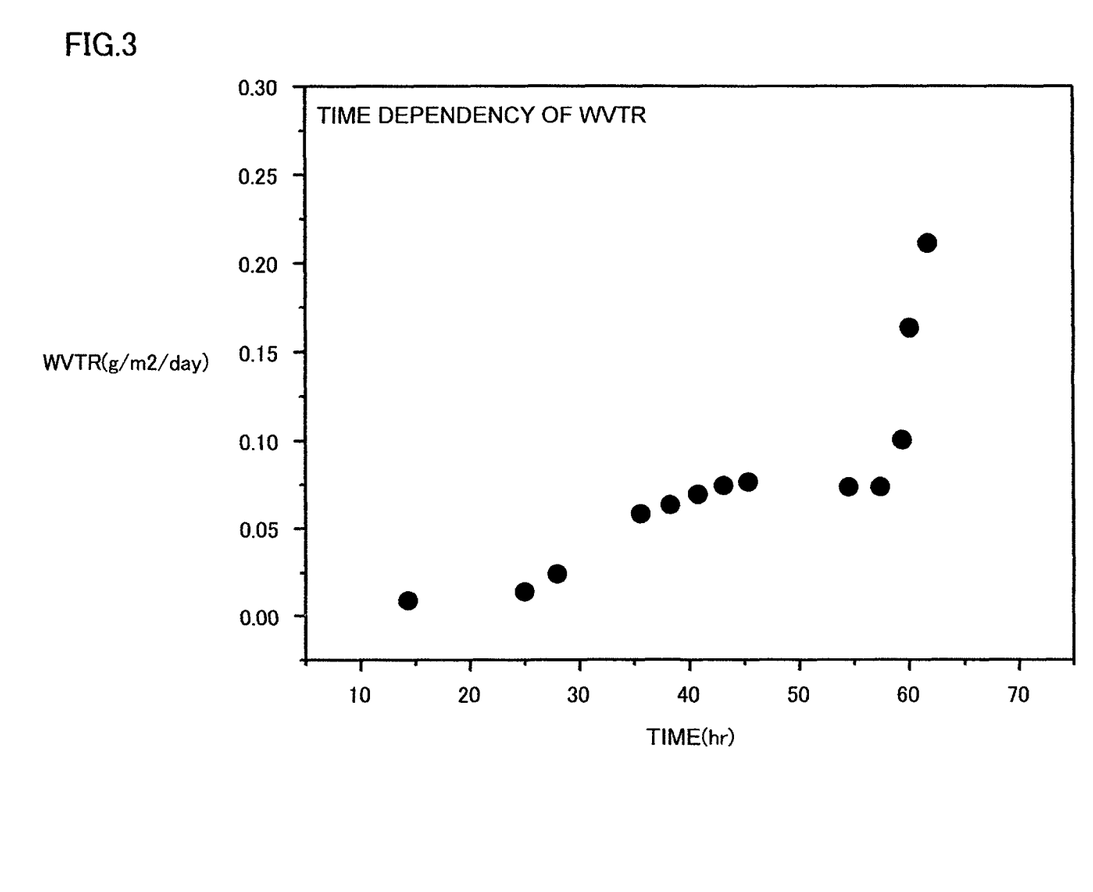
FIG. 3 is a graph showing time dependency of the WVTR (water vapor transmission ratio) measured in a gas barrier film of a Reference Example 1 closely related to the present invention.

FIG. 3 is a graph showing time dependency of WVTR measured in the gas barrier film of Reference Example 1. Namely, the horizontal axis of the FIG. 3 graph represents the time (hr), and the vertical axis represents the WVTR ($g/m^2$/day). Here, the "$g/m^2$/day" represents the mass of water vapor transmitting per day through an area of 1 $m^2$ of the gas barrier film. Incidentally, the measurable lowest limit value in barrier tester L80-5000 of Lyssy Co. is 0.001 ($g/m^2$/day) and thus it is difficult to measure a WVTR less than this limit.

In the WVTR test of FIG. 3, water vapor was supplied from the side of the PEN film substrate. As clearly seen in the graph of FIG. 3, in the gas barrier film of Reference Example 1 having the SiCNFH barrier layer only on the one main surface of the PEN film, the WVTR maintains a value of about 0.02 ($g/m^2$/day) from the beginning of the test until time passage of about 25 hours (about 1 day) and then, however, the WVTR increases to about 0.075 ($g/m^2$/day) until time passage of about 50 hours (about 2 days) and thereafter becomes in a steady state until time passage of about 60 hours (about 2.5 days). After exceeding about 2.5 days, it is seen that the WVTR drastically increases to a level not satisfying the function of the barrier film.

The present inventor has investigated in detail the deterioration phenomenon of the gas barrier film as described above. As a result, it has been found that the PEN film substrate absorbs water molecules with time passage and then the interface between the PEN film and gas barrier layer is particularly deteriorated by the absorbed water molecules so that the gas barrier film is deteriorated.

Example 1

As shown in FIG. 1, the gas barrier film according to Example 1 of the present invention has a single barrier layer 2 on each of both main surfaces of plastic film substrate 1. Specifically, in Example 1, a single SiCNFH barrier layer was formed on each of both main surfaces of the PEN film by Cat-CVD similar to the case of Reference Example 1. In this Example 1, however, a plurality of barrier films were formed with the standard 1MS/$H_2$/$N_2$/$NH_3$/$C_4F_8$ flow rate of 5/200/200/200/20 (sccm) and by variously changing the flow rate and filament temperature.

Figure 4:
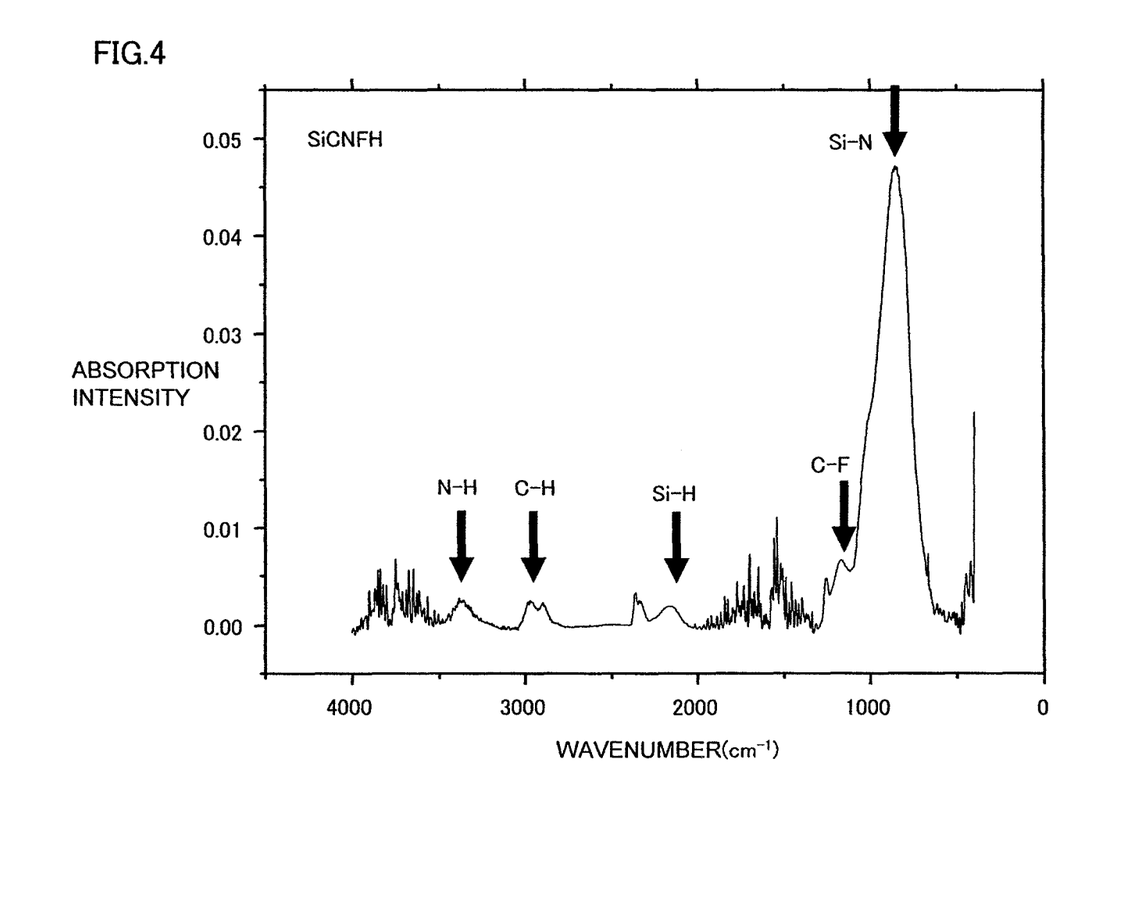
FIG. 4 is a graph showing an example of FTIR of an SiCNFH layer deposited in an Example 1 of the present invention.

FIG. 4 is a graph showing an example of FTIR of an SiCNFH layer deposited in this Example 1. Namely, the horizontal axis of this graph represents the wavenumber ($cm^{-1}$) and the vertical axis represents the absorption intensity. As shown in this graph, there are observed absorption peaks due to an SiN bond, a CF bond, an SiH bond, a CH bond, an NH bond and so forth. Therefore, it is understood that an SiCNFH layer is formed as the organic-inorganic hybrid layer.

Figure 5:
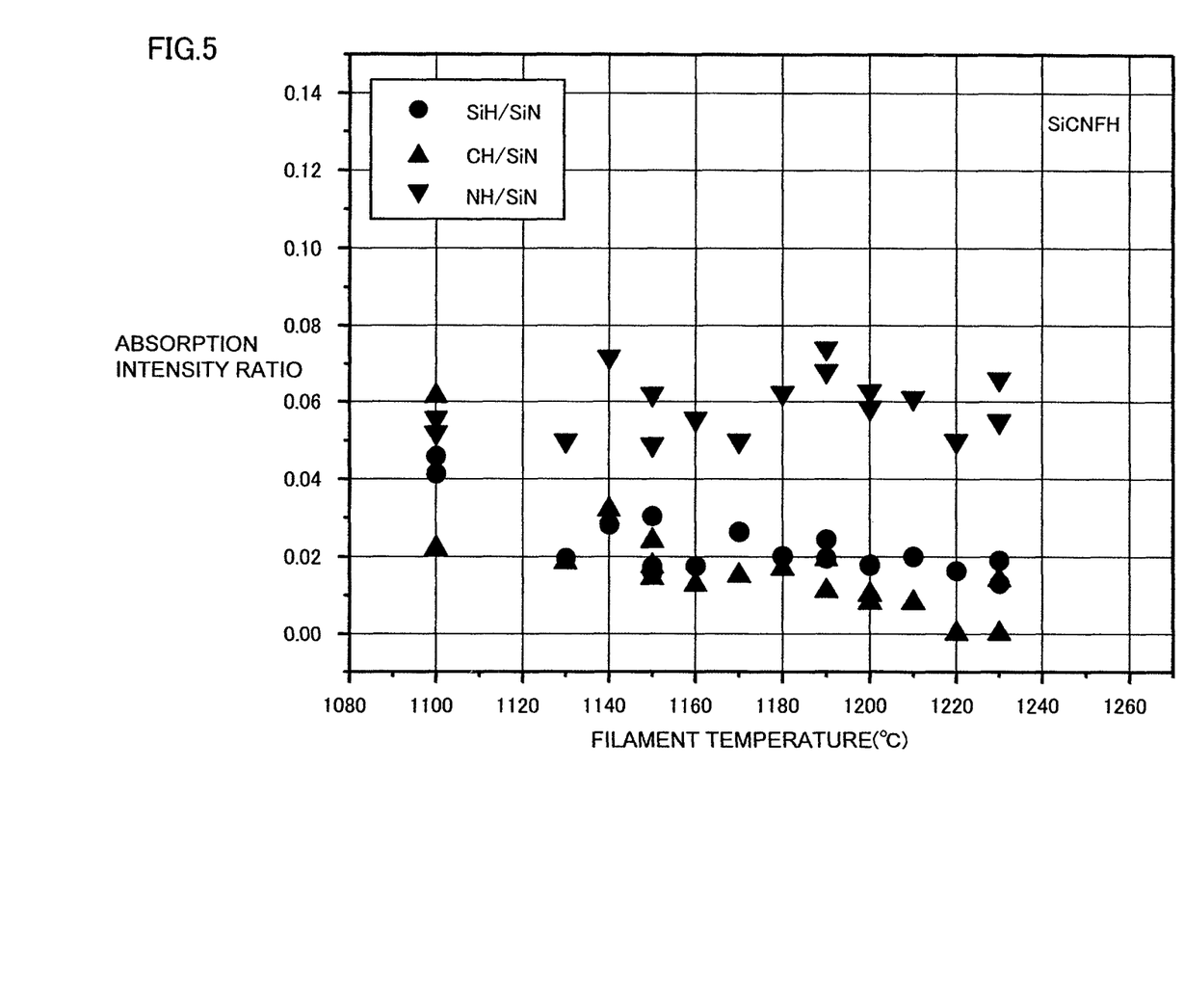
FIG. 5 is a graph showing peak intensity ratios of FTIR spectral absorption related to various atomic bonds in SiCNFH layers deposited by variously changing the filament temperature of Cat-CVD in Example 1.
Figure 6:
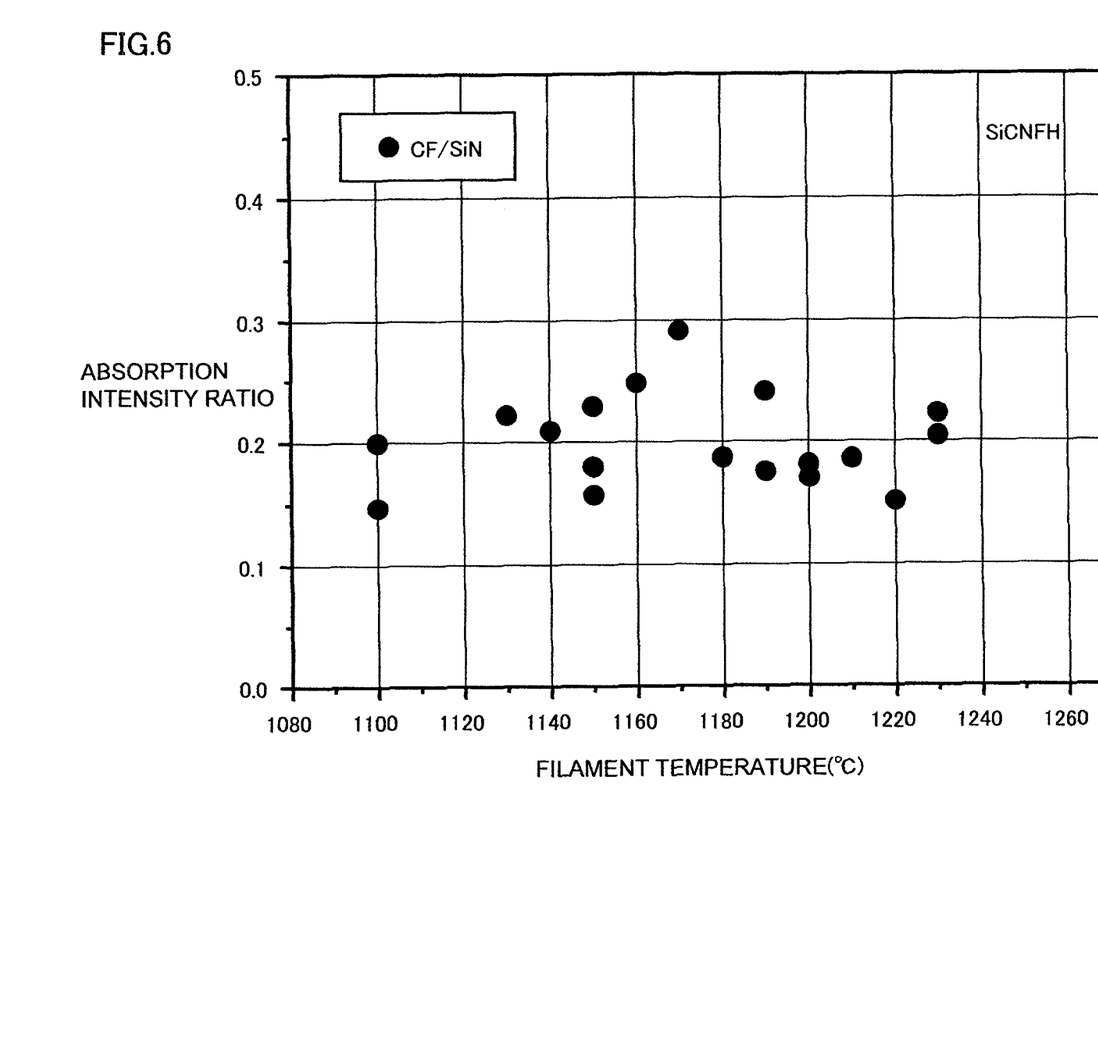
FIG. 6 is a graph showing intensity ratios of FTIR spectral absorption related to the CF atomic bond to that related to the SiN atomic bond in the SiCNFH layers shown in FIG. 5.

FIG. 5 and FIG. 6 show FTIR spectral absorption intensity ratios regarding various kinds of atomic bonds in SiCNFH layers deposited at variously changed filament temperatures in Cat-CVD. Namely, the horizontal axis of these graphs represents the filament temperature and the vertical axis represents the spectral absorption peak intensity ratio.

In FIG. 5, circle marks, triangle marks and inversed triangle marks represent ratios of absorption intensity related to the SiH bond, CH bond and NH bond to that related to the SiN bond, respectively. Circle marks in FIG. 6 represent ratios of absorption intensity related to the CF bond to that related to the SiN bond.

In FIG. 5 and FIG. 6, the SiCNFH layers satisfy conditions of $0.01 < I(SiH)/I(SiN) < 0.05$, $0.00 < I(CH)/I(SiN) < 0.07$, $0.04 < I(NH)/I(SiN) < 0.08$, and $0.05 < I(CF)/I(SiN) < 0.3$. Here, as mentioned before, the "I" represents the FTIR spectral peak intensity related to the atomic bond shown in the parentheses after the "I".

In the case that a single SiCNFH barrier layer satisfying conditions of spectral absorption intensity ratios as those in Example 1 was formed on each of both side of a PEN film, drastic deterioration of the barrier property in the WVTR test was not observed at all even after time passage of about 3 days, differently from the case of above-described Reference Example 1.

It is possible to adjust the barrier property of the gas barrier film by controlling the flow ratios of the source gases, the filament temperature, the film substrate temperature, and so forth. In the case of a gas barrier film having a particularly excellent property in Example 1, no measured value appeared even after time passage of 3 days in the WVTR test and this means that the film had an excellent barrier property of less than 0.001 ($g/m^2$/day).

When the peak intensity ratios of FTIR spectra of the SiCNFH layer in the gas barrier film having the excellent barrier property were analyzed, it was found that the layer satisfied conditions of 0.01<I(SiH)/I(SiN)<0.03, 0.00<I(CH)/I(SiN)<0.02, 0.05<I(NH)/I(SiN)<0.08, and 0.05<I(CF)/I(SiN)<0.25.

Example 2

In the gas barrier film according to Example 2 of the present invention also, a single barrier layer was formed on each of both side of the PEN film similar to the case of Example 1. In this Example 2, however, the SiOCNH layer was formed as the single barrier layer by Cat-CVD.

In this Example 2, a plurality of barrier films were formed with the standard source gas flow rate of 1MS/NH$_3$/H$_2$/N$_2$=5/200/200/200 (sccm) and O$_2$/Ar(gas mixture O$_2$/Ar containing 10% O$_2$)=20 (sccm) in Cat-CVD and also by variously changing the flow rate and filament temperature.

Figure 7:
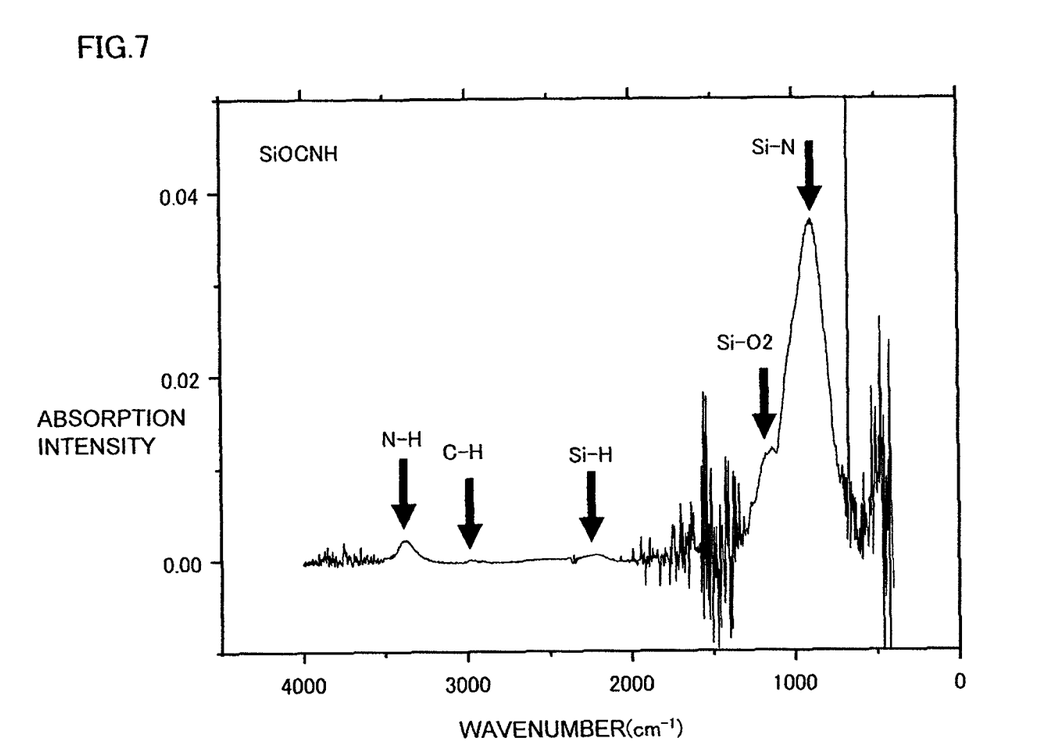
FIG. 7 is a graph showing an example of FTIR of an SiOCNH layer deposited in an Example 2 of the present invention.

FIG. 7 similar to FIG. 5 is a graph showing an example of FTIR of an SiOCNH layer deposited in Example 2. Namely, the horizontal axis of this graph represents the wavenumber (cm$^{-1}$) and the vertical axis represents the absorption intensity. As shown in this graph, there are observed absorption peaks related to an SiN bond, an SiO$_2$ bond, an SiH bond, a CH bond, an NH bond and so forth. Therefore, it is understood that an SiOCNH layer is formed as the organic-inorganic hybrid layer.

In this Example 2 also similar to the case of FIG. 5, the spectral absorption intensity ratios of FTIR related to various atomic bonds were measured in SiOCNH layers deposited at variously changed filament temperatures in Cat-CVD. As a result, it was found that the SiOCNH layers of Example 2 satisfy conditions of 0.1<I(SiH)/I(NH)<0.9, 0.0<I(CH)/I(NH)<0.3, 8<I(SiN)/I(NH)<20, and 2<I(SiO$_2$)/I(NH)<8.

In the case also that a single SiOCNH barrier layer satisfying conditions of spectral absorption intensity ratios as those in Example 2 was formed on each of both side of a PEN film, drastic deterioration of the barrier property in the WVTR test was not observed at all even after time passage of about 3 days, differently from the case of above-described Reference Example 1.

Further, in this Example 2 also, it is possible to adjust the barrier property of the gas barrier film by controlling the flow ratios of the source gases, the filament temperature, the film substrate temperature, and so forth. In the case of a gas barrier film having a particularly excellent property in Example 2 also, no measured value appeared even after time passage or 3 days in the WVTR test and this means that the film had an excellent barrier property of less than 0.001 (g/m$^2$/day).

When the peak intensity ratios of FTIR spectra of the SiOCNH layer in the gas barrier film having the excellent barrier property were analyzed, it was found that the layer satisfied conditions of 0.1<I(SiH)/I(NH)<0.5, 0.0<I(CH)/I(NH)<0.2, 10<I(SiN)/I(NH)<20, and 2<I(SiO$_2$)/I(NH)<5.

Example 3

In the gas barrier film according to Example 3 of the present invention also, a single barrier layer was formed on each of both side of the PEN film similar to the case of Example 1. In this Example 3, however, the SiCNH layer was formed as the single barrier layer by Cat-CVD.

In this Example 3, a plurality of barrier films were formed with the standard source gas flow rate of 1MS/NH$_3$/H$_2$/N$_2$=5/200/200/200 (sccm) in Cat-CVD and also by variously changing the flow rate and filament temperature.

Figure 8:
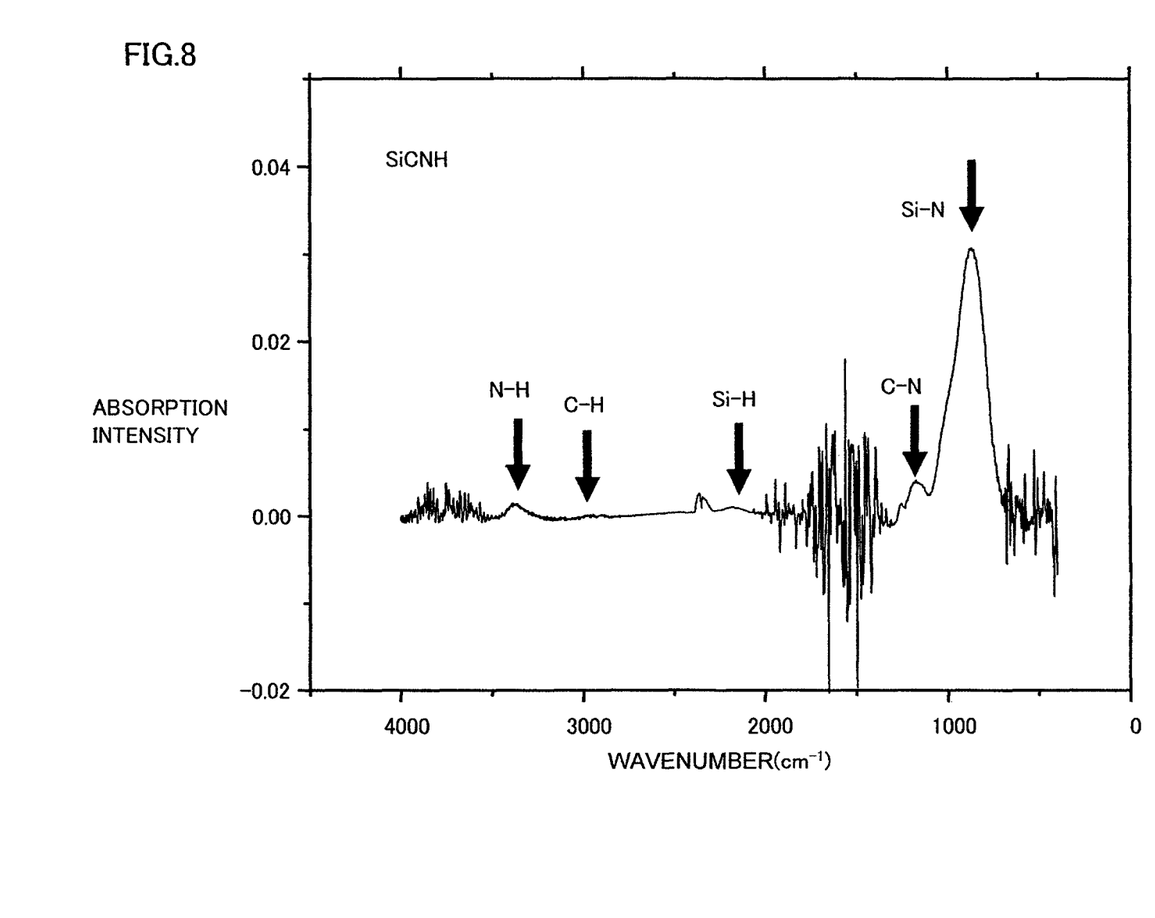
FIG. 8 is a graph showing an example of FTIR of an SiCNH layer deposited in an Example 3 of the present invention.

FIG. 8 similar to FIG. 5 is a graph showing an example of FTIR of an SiCNH layer deposited in Example 3. Namely, the horizontal axis of this graph represents the wavenumber (cm$^{-1}$) and the vertical axis represents the absorption intensity. As shown in this graph, there are observed absorption peaks related to an SiN bond, an CN bond, an SiH bond, a CH bond, an NH bond and so forth. Therefore, it is understood that an SiCNH layer is formed as the organic-inorganic hybrid layer.

In this Example 3 also similar to the case of FIG. 5, the spectral absorption intensity ratios of FTIR related to various atomic bonds were measured in SiCNH layers deposited at variously changed filament temperatures in Cat-CVD. As a result, it was found that the SiCNH layers of Example 3 satisfy conditions of 0.01<I(SiH)/I(SiN)<0.05, 0.00<I(CH)/I(SiN)<0.07, and 0.04<I(NH)/I(SiN)<0.08.

In the case also that a single SiCNH barrier layer satisfying conditions of spectral absorption intensity ratios as those in Example 3 was formed on each of both side of a PEN film, drastic deterioration of the barrier property in the WVTR test was not observed at all even after time passage of about 3 days, differently from the case of above-described Reference Example 1.

Further, in this Example 3 also, it is possible to adjust the barrier property of the gas barrier film by controlling the flow ratios of the source gases, the filament temperature, the film substrate temperature, and so forth. In the case of a gas barrier film having a particularly excellent property in Example 3 also, no measured value appeared even after time passage of 3 days in the WVTR test and this means that the film had an excellent barrier property of less than 0.001 (g/m$^2$/day).

When the peak intensity ratios of FTIR spectra of the SiCNH layer in the gas barrier film having the excellent barrier property were analyzed, it was found that the layer satisfied conditions of 0.01<I(SiH)/I(SiN)<0.03, 0.00<I(CH)/I(SiN)<0.02, and 0.05<I(NH)/I(SiN)<0.08.

Modified Example

In each of the above-described Examples, it has been exemplarily explained that the same kinds of barrier layers were formed on both the side of the plastic film. However, it is not necessary that the gas barrier layers deposited on both the side of the plastic film are of the same kind. That is, when a barrier layer selected from the SiCNFH layer, SiOCNH layer and SiCNH layer is deposited on one main surface of the plastic film, one of the SiCNFH layer, SiOCNH layer and SiCNH layer of a kind different from the layer selected on the one main surface may be deposited on the other main surface.

For Example, when the WVTR measurement was conducted on an example of a gas barrier film sample in which an SiCNFH layer was formed on one main surface of the PEN film and an SiOCNH layer was formed on the other main surface, no data of detectable limit 0.001 (g/m$^2$/day) could be obtained even after time passage of 6 days and it was clear that the WVTR was less than 0.001 (g/m$^2$/day).

In the meantime, an extremely high barrier property against water vapor is required in the case of a gas barrier film used for the flexible organic EL device. In this case, two or more layers of kinds different from each other selected from the SiCNFH layer, SiOCNH layer and SiCNH layer can be formed on each of the both side of the plastic film by Cat-CVD so as to significantly improve the lifetime and reliability of the organic EL device.

Further, when it is desired that the surface of the gas barrier film has an anti-contamination property, a water-repellent property and so forth, it is preferable that the outermost layer of the gas barrier film is the SiCNFH layer containing fluorine. On the other hand, when it is desired that the surface of the gas barrier film is adaptable to adhesive agents and so forth, it is preferable that the outermost layer of the film is the SiOCNH layer or SiCNH layer. Particularly in the case of forming a transparent conductive oxide film on the gas barrier film, it is preferable that the outermost layer of the barrier film is formed with the SiOCNH layer that can have good adhesiveness with the oxide layer.

In the above-described Examples, the PEN film has been exemplarily shown as a plastic film substrate. However, the plastic film usable as a substrate is not restricted to that of PEN and it goes without saying that it is also possible to use the other various plastic films such as of PET (polyethylene terephthalate), PI (polyimide), fluorine resin, PC (polycarbonate), PAR (polyarylate), PES (poly ether sulfone), and heat-resistive liquid crystal film. In Cat-CVD, the temperature of the substrate film is liable to be increases by heat radiation of the filament. However, since a cooling device is added to the pedestal for the substrate film, it is only required that the plastic film has a glass transition temperature of 120° C. or more, a melting point of 200° C. or more, or a liquid crystal transition temperature of 200° C. or more.

In the meantime, it is desirable that the surface of the substrate plastic film as flat or smooth as possible. The reason for this is that when the surface roughness of the plastic film is significant, the coverage becomes insufficient and/or pinholes are caused and then the barrier property of the gas barrier film is significantly degraded starting from those local defects. Therefore, when the surface roughness of the substrate plastic film is significant, it is preferable to subject the surface to a smoothing treatment and/or coat the surface with an additional smoothing layer. Incidentally, the PEN films used in the above-described Examples had a surface roughness (Ra value) of 10 nm or less.

(Applications)

As explained in the above BACKGROUND ART, the gas barrier films are preferably usable as protective layers for various articles such as food, medicine, a touch panel, an organic EL (electroluminescence) device, an inorganic EL device, a solar cell, and electronic paper.

First, the gas barrier films of the present invention can be used for bags for protecting food, medicine, electronic parts, and the other goods. Specifically, it is possible to form a protective bag by sandwiching an article to be protected between two barrier films of the present invention whose barrier property is not deteriorated for a long time period and then sealing the periphery of those films with an adhesive agent. At this time, it is also preferable to encapsulate nitrogen gas and/or deoxidizer in the protective bag.

It is also possible to form an electrode film having a high gas barrier property and durability thereof by forming a conductive layer on at least one main surface of the gas barrier film of the present invention. As such a conductive layer, it is of course possible to provide a metal layer by evaporation. It is further possible to form a transparent conductive oxide layer on the gas barrier film. The gas barrier film having such a transparent conductive oxide film can have both the functions of an electrode layer and a gas barrier layer in one of various electronic display devices and thus has excellent usability. Specifically, such a gas barrier film can be used as an electrode layer having an excellent gas barrier property in a touch panel for example.

Furthermore, it is clear to a person skilled in the art that the gas barrier film of the present invention capable of maintaining an extremely high barrier property for a long time period as described above can be preferably applicable to electronic devices such as particularly an organic EL device and also an inorganic EL device, a solar cell panel, electronic paper, etc. that are required to maintain their gas barrier property for a long time period. In this case, by utilizing the barrier film of the present invention as a substrate, it is also possible to provide a flexible organic EL device, a flexible inorganic EL device, a flexible thin-film solar cell, or flexible electronic paper.

INDUSTRIAL APPLICABILITY

As described above, according to the present invention, by forming a particular organic-inorganic hybrid gas barrier layer on each of both main surface of a plastic film, it is possible to provide a gas barrier film that can realize improvement of its gas barrier property as well as simplification and low-cost of production thereof, as compared to the prior art.

Further, by utilizing such a gas barrier film, it is possible to prevent deterioration of properties of various electronic devices and also possible to provide a bag having a gas barrier property capable of protecting various goods.

REFERENCE SIGNS LIST

1 plastic film, 2 gas barrier layer of organic-inorganic hybrid layer deposited by Cat-CVD, 11 reaction chamber, 11a gas inlet, 11b gas outlet, 12 heating filament, 13 base or substrate (plastic film), 14 pedestal.

The invention claimed is:

1. A gas barrier film comprising a gas barrier layer in direct contact with each of both main surfaces of a plastic film selected from the group of PEN, PET, PI, fluorine resin, PC, PAR, PES, and heat-resistive liquid crystal films,
 wherein the gas barrier layer is an SiCNFH layer, an SiOCNH layer or an SiCNH layer deposited by Cat-CVD,
 the SiCNFH layer satisfying conditions of $0.01 < I(SiH)/I(SiN) < 0.03$, $0.00 < I(CH)/I(SiN) < 0.02$, $0.05 < I(NH)/I(SiN) < 0.08$, and $0.05 < I(CF)/I(SiN) < 0.25$;

the SiOCNH layer satisfying conditions of $0.1 < I(SiH)/I(NH) < 0.5$, $0.0 < I(CH)/I(NH) < 0.2$, $10 < I(SiN)/I(NH) < 20$, and $2 < I(SiO_2)/I(NH) < 5$; and the SiCNH layer satisfying conditions of $0.01 < I(SiH)/I(SiN) < 0.03$, $0.00 < I(CH)/I(SiN) < 0.02$ and $0.05 < I(NH)/I(SiN) < 0.08$;

where the "I" represents peak intensity of Fourier transform infrared spectroscopy related to the atomic bond shown in the parentheses after the "I".

2. The gas barrier film according to claim 1, wherein an additional barrier layer of the SiCNFH layer, SiOCNH layer or SiCNH layer is stacked on the barrier layer in contact with the plastic film, and the additional barrier layer is of a kind different from the barrier layer in direct contact with the plastic film.

3. The gas barrier film according to claim 1, wherein the plastic film is a heat-resistive plastic film having a glass transition temperature of 120° C. or more, a melting point of 200° C. or more, or a liquid-crystal transition temperature of 200° C. or more.

4. The gas barrier film according to claim 1, wherein the plastic film has been subjected to a surface-planarization process.

5. The gas barrier film according to claim 1 additionally comprising an electric-conductive layer over at least one of both main surfaces of the gas barrier film.

6. An electronic device comprising the gas barrier film of claim 1 as a protective layer.

7. The electronic device according to claim 6 is one of a touch panel, an organic EL device, an inorganic EL device, a solar cell, and electronic paper.

8. A gas barrier bag formed with the gas barrier film of claim 1.

9. A method for producing the gas barrier film of claim 1, wherein the gas barrier film is formed by Cat-CVD using source materials selected from an organic silane compound, an organic amino-silicon compound, ammonia, fluorocarbon, oxygen, and hydrogen.

* * * * *